United States Patent [19]

Treglio

[11] Patent Number: 5,306,408
[45] Date of Patent: Apr. 26, 1994

[54] METHOD AND APPARATUS FOR DIRECT ARC PLASMA DEPOSITION OF CERAMIC COATINGS

[75] Inventor: James R. Treglio, San Diego, Calif.
[73] Assignee: ISM Technologies, Inc., San Diego, Calif.
[21] Appl. No.: 905,342
[22] Filed: Jun. 29, 1992
[51] Int. Cl.$^5$ ............................................. C23C 14/32
[52] U.S. Cl. ........................... 204/192.38; 204/298.41; 427/580
[58] Field of Search .................. 204/192.38, 298.41; 427/580

[56] References Cited

U.S. PATENT DOCUMENTS

| | | | |
|---|---|---|---|
| 4,452,686 | 6/1984 | Axenov et al. | 204/298.41 |
| 4,551,221 | 11/1985 | Axenov et al. | 204/298.41 |
| 4,620,913 | 11/1986 | Bergman | 204/192.38 |

FOREIGN PATENT DOCUMENTS

| | | | |
|---|---|---|---|
| 1-234557 | 9/1989 | Japan | 204/192.38 |
| 2202237 | 9/1988 | United Kingdom | 204/298.41 |

Primary Examiner—Aaron Weisstuch

[57] ABSTRACT

A method and apparatus for coating high temperature resistant, electrically-conductive, ceramic compounds, such as titanium carbides and diborides, onto an organic substrate, which may be an organic resin matrix composite. The apparatus basically comprises a vacuum arc plasma generator, a high-voltage insulated substrate holding table and a plasma channel. The plasma generator includes a vacuum chamber having a cylindrical cathode of the material to be deposited, surrounded by a ceramic insulator which is in turn surrounded by a metal trigger ring in contact with a trigger electrode. When a vacuum arc discharge is initiated, a plasma flows outwardly from the cathode through a hole in an adjacent anode and into a drift tube. The drift tube has a plurality of magnets around the tube exterior to push the plasma away from the tube, maintain a uniform plasma density and guide the plasma towards a substrate on a movable high voltage insulated substrate support. The cathode material is nearly 100% ionized, giving the ions impinging on the organic substrate sufficient kinetic energy to react with and adhere tightly to the target substrate without additional heating. The amount of kinetic energy is controllable to provide the selected degree of substrate surface ion mixing with the coating elements.

14 Claims, 1 Drawing Sheet

METHOD AND APPARATUS FOR DIRECT ARC PLASMA DEPOSITION OF CERAMIC COATINGS

BACKGROUND OF THE INVENTION

This invention relates in general to the formation of electrically-conductive ceramic compound coatings on substrates and, more particularly, to the direct ion mixed plasma deposition of such compounds onto organic substrates such as organic matrix composites.

A number of different methods have been developed for depositing materials, generally metals, in the form of particles or ions onto a substrate surface to form an adherent, uniform coating. Among these are thermal deposition, cathode sputtering and chemical vapor deposition. While useful in particular applications, these methods suffer from several problems, including a tendency to coat other system surfaces than the substrate with the material being deposited, requiring frequent cleaning, contamination problems when the coating material is changed and a waste of often expensive coating material. Generally, these processes require that the substrate surface be heated to a very high temperature which often damages the substrate material, especially when the substrate is an organic material or an organic matrix composite material. The high deposition temperatures also lead to thermal stresses that may cause coating delamination.

Vacuum arc deposition has a number of advantages for coating difficult materials, such as refractory metals, onto substrate. Vacuum arc deposition involves establishing of an arc, in a vacuum, between a cathode formed from the coating material and an anode, which results in the production of a plasma of the cathode material suitable for coating. The process does not involve gases, making control of deposition rate easier and simplifies changing coating materials. Typical vacuum arc deposition systems are described in U.S. Pat. Nos. 3,566,185, 3,836,451 and 4,714,860. Vacuum arc deposition, sometimes referred to as cathodic arc deposition, is used commercially, typically to produce titanium nitride coatings on tooling.

A number of problems remain, however, which limit the use of vacuum arc deposition. Coatings often suffer from adherence and low density problems, particularly when an organic matrix composite material is used as the substrate. Difficulties are often encountered in obtaining a desired coating composition where ceramic materials, such as electrically-conductive ceramic compounds (e.g., borides, nitrides or carbides) are being applied.

Thus, there is a continuing need for improved methods and apparatus for forming uniform, adherent coatings from metal compounds, in particular on organic matrix composite substrates.

SUMMARY OF THE INVENTION

It is, therefore, an object of this invention to provide an improved method and apparatus capable of forming adherent coatings of high temperature resistant, electrically-conductive, ceramic compounds on organic substrates. Another object is to provide a method and apparatus capable of producing smooth, hard, electrically-conductive ceramic coatings having uniform high density on organic substrates. A further object is to form, by ion mixed plasma techniques, coatings of electrically-conductive ceramic compounds having precise stoichiometry. Yet another object is to form coatings of electrically-conductive ceramic compounds on organic substrates having a diffuse interface between coating and substrate.

The above-noted objects, and others, are accomplished in accordance with this invention by a method and apparatus using a direct ion mixed plasma deposition system. The apparatus basically comprises a vacuum chamber enclosing a vacuum arc plasma generator, an anode, and a high voltage insulated table for holding a substrate to be coated.

The plasma generator includes a cylindrical cathode formed from the compound to be deposited, surrounded by a ceramic electrical insulator which is in turn surrounded by a metal trigger ring in contact with a trigger electrode. The anode is typically a copper plate having a central hole for passage of the plasma.

A plasma channel or drift tube may be included to surround the plasma between anode and target. This channel, if used, typically is a tube of copper or other non-magnetic material with the opening extending from the anode hole to a location adjacent to the target table. The channel serves to guide the plasma to the target and to increase plasma uniformity. A plurality of magnets, preferably samarium-cobalt magnets, are located in a circle around the volume between anode and substrate. If a plasma channel is used, the magnets are attached to the outside of the tube in a manner such as to form a ring of magnetic cusps around the interior of the plasma channel. These cusps push plasma away from the tube interior wall, guide the plasma to the substrate and keep the plasma density uniform.

The basic process of this invention includes evacuating the chamber, initiating ionization at the cathode to form a plasma between the anode and cathode, directing the plasma through the hole in the anode and along the drift tube or channel and coating the ions from the plasma onto the organic substrate material. Preferred steps, materials, and conditions are discussed in detail below.

BRIEF DESCRIPTION OF THE DRAWING

Details of the invention, and of certain preferred embodiments thereof, will be further understood upon reference to the drawing, wherein.

DETAILED DESCRIPTION OF PREFERRED EMBODIMENTS

Figure 1:
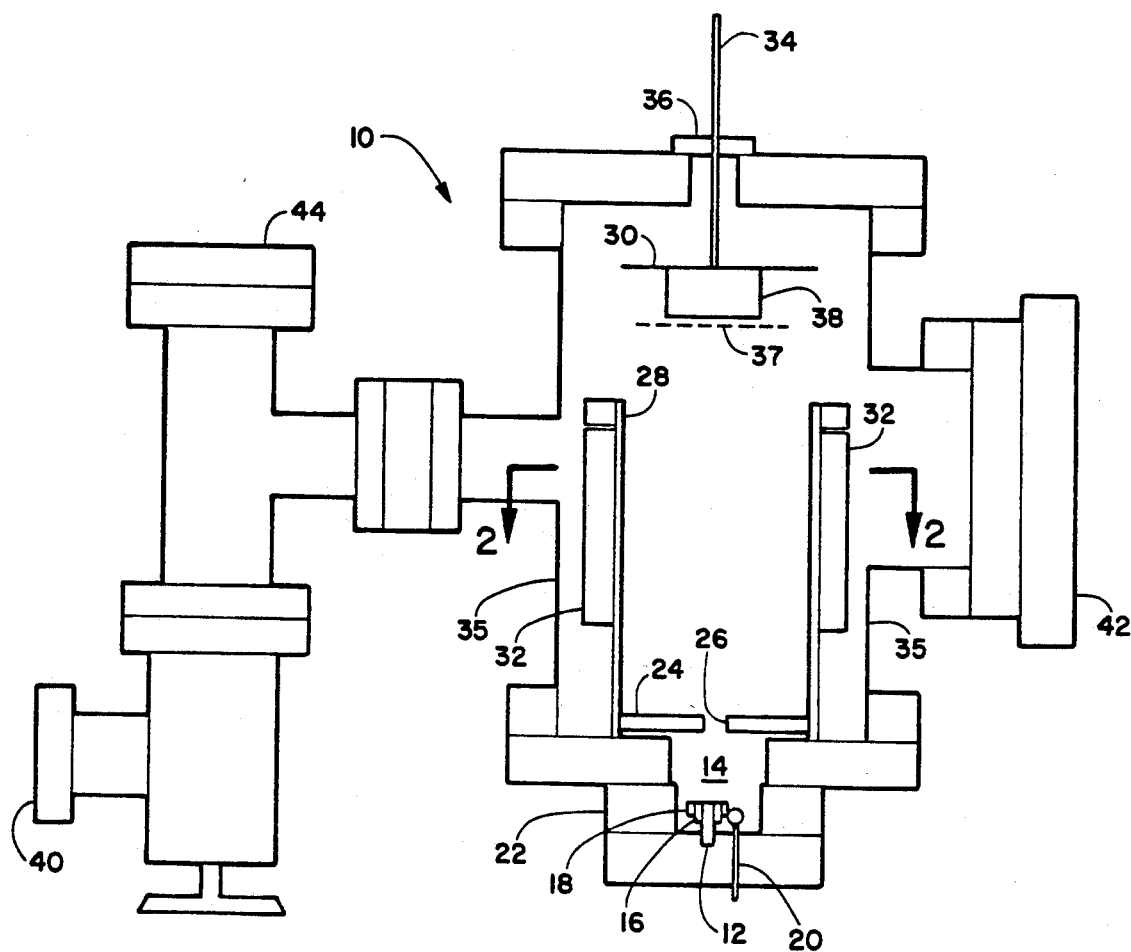
FIG. 1 is a schematic diagram of the plasma deposition apparatus of this invention.

Referring now to FIG. 1, there is seen a schematic representation of a vacuum chamber 10 containing the apparatus for direct ion mixed plasma deposition. A cathode 12 is positioned in a chamber 14. Any suitable metal compound may be used to form cathode 12. Typical such compounds include those selected from the group consisting of borides, carbides, silicides, and nitrides of titanium, tungsten, aluminum, molybdenum, niobium, and tantalum and mixtures thereof. Best results are obtained with titanium diboride, titanium carbide, titanium nitride, tungsten carbide, and mixtures thereof. In many cases high temperature resistant, electrically-conductive ceramics are preferred for maximum hardness and abrasion resistance. Optimum results are obtained with titanium diboride for high temperature applications due to its hardness, stability, and resistance to oxidation up to about 1200° F. Cathode 12 may have any suitable diameter, typically from about 3 to 10 mm.

Cathode 12 is surrounded by an insulating ring 16, formed from any conventional suitable material. A trigger ring 18, typically steel, is formed around insulating ring 16. A conventional trigger 20 is placed in contact with trigger ring 18. The walls 22 of chamber 14 are formed from any conventional electrically insulating material. If desired, the multiple cathode assembly as shown in U.S. Pat. No. 5,089,707 can be used in place of the cathode assembly shown. This would permit the rapid and convenient application of plural layers of different materials.

An anode 24 is positioned on the opposite side of chamber 14 from cathode 12. Anode has at least one perforation 26 generally aligned with cathode 12. Anode 26 is formed from any suitable conductor, such as copper.

Figure 2:
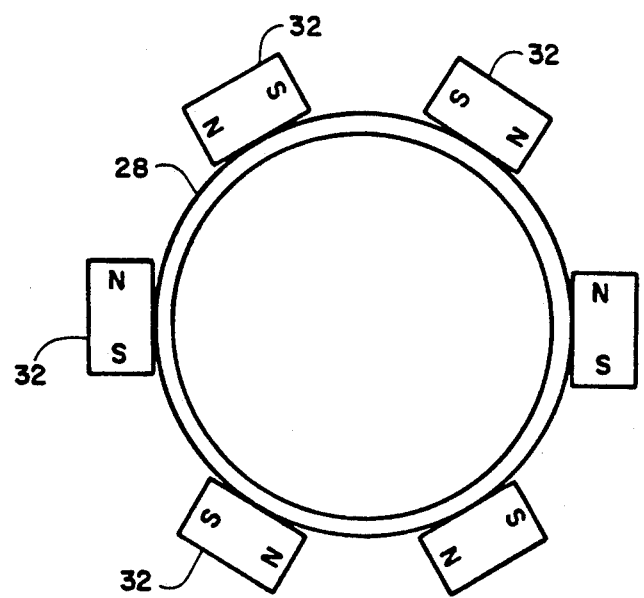
FIG. 2 is a transverse section view through the plasma drift tube or channel, taken on line 2—2 in FIG. 1.

A channel or drift tube 28, typically having a diameter of from about 100 to 200 mm, may extend, from anode 26 toward an insulated substrate support structure 30. Channel 28 may be omitted if desired. Tube 28 is formed from a non-magnetic metal, such as copper. A plurality of permanent magnets 32 are arranged around the exterior of tube 28 in a pattern as shown in FIG. 2. Other support means will be provided for magnets 32, such as conventional brackets on the interior of vacuum chamber walls, if drift tube or channel 28 is eliminated. While any suitable magnets may be used, cobalt-samarium magnets are preferred for optimum performance. While any suitable even number of magnets may be used, an even number from about 4 to 12 is preferred. The larger the diameter of tube the greater the number of magnets that will be optimum. Preferably, the magnets are spaced from about 10 to 20 mm apart, edge-to-edge. Magnets 32 are arranged with like poles of adjacent magnets facing each other.

Support table 30 is formed from a high voltage insulating material and is mounted on a mechanism 36 extending through a high-voltage feed-through 34 in the wall of vacuum chamber 10 to permit the distance from the table to drift tube 28 to be varied.

The organic substrate 38 to be coated is secured to support 30 in a conventional manner. Any suitable organic material can be coated in this apparatus, including relatively low melting temperature materials. Typical materials include composites of fibers in an resin matrix, such as graphite fibers in an epoxy resin matrix, carbon-carbon materials, etc.

If substrate 38 is insulating, in order to apply a negative bias to the substrate, a conductive screen 37 or the like is placed over the target surface and the desired bias is applied to the screen.

Vacuum chamber 10 includes the usual operational components, such as a connection 40 to a roughing vacuum pump, a connection 42 to a high vacuum pump and an ion gauge 44 to measure the degree of vacuum achieved.

In the operation of this apparatus, a suitable organic material substrate 38 is placed on the substrate support table 30 and a cathode 12 of a selected metal compound is installed. The chamber 10 is pumped down to a suitable vacuum through connections 40 and 42. When a high voltage is applied between trigger ring 18 and cathode 12, a vacuum arc discharge is initiated from a tiny spot (typically less than one micrometer in diameter) on the cathode surface. The current density in this spot is enormous, well over one million amperes per square inch. So large is the current density that material from the cathode is pulled from the surface and ionized. Ionization is almost total, to the extent that most of the ions are multiply charged. The trigger pulse typically lasts only about a tenth of a millisecond, just long enough to initiate the vacuum arc breakdown.

The plasma from this arc fills the cavity 14 between cathode 12 and anode 24 so that a relatively low (typically about 20 volts) voltage between the cathode and anode is sufficient to sustain the arc. For a typical titanium diboride cathode, the plasma will consist of a combination of titanium ions and boron ions, with twice the number of boron ions as titanium ions. The ionization is nearly 100%. It is so extensive that most of the titanium ions will be doubly charged.

The plasma produced by the arc flows outward from cathode 12 through the hole 26 in anode 24 and into plasma drift tube or channel 28. The channel 28 guides the plasma towards target 38.

The coating is applied by exposing the substrate surface to the plasma while typically maintaining the substrate surface at a bias of from about 50 to 200 volts negative. In this way, the plasma ions are drawn to the surface with enough energy to form the appropriate bonds but with little sputtering of the surface or surface penetration. The coating is thus plasma deposited without ion mixing.

In a second embodiment of the coating step, the substrate bias is alternately varied from about 50 to 200 volts negative to about 10 to 30 kilovolts negative. Preferably, the bias is varied at a frequency of from about 10 to 30 cycles per second. This causes the coating to be sequentially applied and ion mixed by itself. The ion mixing sequence helps densify the coating, further improves adhesion, and applies additional compressive stress to the coating. This compressive stress helps keep the coating from cracking, particularly where differences in the coefficient of thermal expansion produces stresses.

The deposition is continued for the time necessary to produce a coating of the desired thickness, typically from about 3 to 10 micrometers. If desired, multiple layers of different compounds can be produced by changing the composition of cathode 12. This is particularly convenient with this method and apparatus, since little, if any, of the material is deposited on the chamber walls, etc. from which it could be released to contaminate later layers of different composition.

To maximize the adherence of the coating to the substrate surface, that surface should be clean of any impurities. Conventional cleaning techniques often do not remove all of the material from the substrate surface that can interfere with coating adherence. Thus, it may be preferable to sputter away a small amount of the surface to improve cleaning.

In accordance with the method of this invention, the substrate surface is partially ion implanted prior to applying the coating. Ion implantation strengthens the surface and provides the desirable sputter cleaning. Preferably, the materials used to implant the surface are the ones to be used to form the coating. In this manner, no impurities can be introduced into the system. In addition, adhesion is aided by eliminating any sharp interface between the coating and the treated surface. This implantation is preferably performed using the apparatus described above and the cathode that is to be used to form the coating. The plasma is formed as described above and the substrate is biased to a high negative voltage, preferably from about 10 to 30 kilovolts negative. The ions are drawn from the plasma to the substrate, impinging with sufficient energy to penetrate the surface deeply and produce an ion implanted layer. Typically, with a titanium diboride cathode, the surface is implanted with titanium and boron. The titanium ions penetrate into the surface approximately half the distance the boron ions penetrate. In order to prevent excessive heating of the substrate, ion implantation is conducted at a very low dose rate. Total ion implantation dose is preferably from about $3 \times 10^{16}$ to $2 \times 10^{17}$ atoms/cm$^2$, with optium results at about $10^{17}$ atoms/cm$^2$. Without removing the substrate from the chamber, conditions are changed to the coating conditions described above and coating proceeds.

Other applications, variations and ramifications of this invention will occur to those skilled in the art upon reading this disclosure. Those are intended to be included within the scope of this invention, as defined in the appended claims.

We claim:

1. Apparatus for forming a coating on a substrate by direct ion mixed arc plasma deposition, which comprises:
   a vacuum chamber;
   a cathode assembly within said chamber, said cathode assembly comprising:
     a cathode adapted to comprise the material of said coating;
     an electrically insulating ceramic ring around said cathode;
     a trigger ring around said insulating ring; and a trigger electrode in contact with said trigger ring;
   an anode spaced from said cathode, said anode having at least one perforation, said anode adapted to receive and pass ions including ions of said coating material from said cathode through said perforation;
   a substrate support means spaced from said anode and adapted to support a substrate to be coated with said substrate positioned to receive said ions passing through said anode; and
   a plurality of permanent magnets arranged around the volume between said anode and said target, said magnets arranged with like poles on adjacent magnets in a face-to-face pattern;
   whereby a uniform, adherent, substantially stoichiometric, coating of the cathode material is formed on said target.

2. The apparatus according to claim 1 further including a drift tube positioned to receive ions passing through said anode, and guide said ions toward said substrate, said guide tube surrounding at least part of the path between said anode and said substrate and comprising a tube of non-magnetic material.

3. The apparatus according to claim 2 wherein said drift tube is formed from copper.

4. The apparatus according to claim further including an electrically conductive screen adjacent to the surface of said substrate facing toward said anode.

5. The apparatus according to claim 1 wherein said magnets are samarium-cobalt magnets.

6. The apparatus according to claim 1 where said anode is substantially planar, lies substantially perpendicular to the line between the centers of said cathode and said substrate and one anode perforation surrounds said line.

7. The method of forming an electrically-conductive, ceramic compound coating on a substrate by direct ion mixed arc plasma deposition, which comprises the steps of:
   providing a vacuum chamber containing, in seriatim, a cathode, a perforated anode, and a substrate;
   said cathode comprising a high temperature resistant, electrically-conductive, ceramic compound;
   initiating an arc at said cathode to form a mixed plasma moving toward and through said anode;
   guiding said plasma passing through said anode toward said substrate by surrounding the line between said cathode and said anode with a non-magnetic drift tube and positioning a plurality of permanent magnets along the exterior of said drift tube with the like poles of adjacent magnets in a face-to-face relationship to form magnetic cusps between adjacent magnets;
   maintaining a substantially uniform ion mixture and plasma density as said plasma moves toward said substrate;
   impinging said plasma onto said target whereby a substantially stoichiometric adherent coating of said compound is formed on said target.

8. The method according to claim 7 including maintaining said substrate at a bias of from about 50 to 200 volts negative during deposition.

9. The method according to claim 7 including varying the bias on said target from about 50 to 200 volts negative to about 10 to 30 kilovolts.

10. The method according to claim 9 wherein said bias is varied at a frequency of from about 10 to 30 cycles per second.

11. The method according to claim 10 further including the step of cleaning the target surface by sputtering away a small amount of the substrate surface before applying the coating.

12. The method according to claim 11 wherein said cleaning is accomplished and ions are implanted in the target surface by initiating cathode ionization with the substrate at a bias of from about 10 to 30 kilovolts for a period sufficient to apply from about $3 \times 10^{16}$ to $2 \times 10^{17}$ atoms/cm$^2$.

13. The method according to claim 7 wherein said ceramic compound is selected from the group consisting of borides, carbides, silicides and nitrides of titanium tungsten, aluminum, molybdenum, tantalum, niobium, and mixtures thereof.

14. The method according to claim 7 wherein said substrate comprises an organic resin matrix composite material.

* * * * *